United States Patent [19]
Tiffany, III

[11] Patent Number: 6,025,054
[45] Date of Patent: Feb. 15, 2000

[54] SMART CARDS HAVING GLUE-POSITIONED ELECTRONIC COMPONENTS

[75] Inventor: Harry J. Tiffany, III, Weldona, Colo.

[73] Assignee: CardXX, Inc., Windsor, Colo.

[21] Appl. No.: 09/176,244

[22] Filed: Oct. 21, 1998

Related U.S. Application Data

[62] Division of application No. 08/925,593, Sep. 8, 1997, Pat. No. 5,955,021
[60] Provisional application No. 60/048,704, May 19, 1997.

[51] Int. Cl.[7] .................................................. G06K 19/02
[52] U.S. Cl. ........................ 428/189; 235/488; 235/492; 235/487
[58] Field of Search ................................. 235/488, 492, 235/487; 428/189

[56] References Cited

U.S. PATENT DOCUMENTS

| | | |
|---|---|---|
| 4,339,407 | 7/1982 | Leighton . |
| 4,961,893 | 10/1990 | Rose . |
| 5,164,144 | 11/1992 | Rose ........................................ 264/511 |
| 5,350,553 | 9/1994 | Glaser et al. . |
| 5,399,847 | 3/1995 | Droz . |
| 5,417,905 | 5/1995 | Lemaire et al. . |
| 5,423,705 | 6/1995 | Solomon, III . |
| 5,498,388 | 3/1996 | Kodai et al. . |
| 5,510,074 | 4/1996 | Rose . |

FOREIGN PATENT DOCUMENTS

| | | |
|---|---|---|
| 0 350 179 A1 | 1/1990 | European Pat. Off. . |
| 0449691 | 10/1991 | European Pat. Off. ....... G06K 19/77 |
| 95400365 | 8/1995 | European Pat. Off. . |

*Primary Examiner*—Christopher Raimund
*Attorney, Agent, or Firm*—Dorr, Carson, Sloan & Birney, P.C.

[57] ABSTRACT

Smart cards having high quality external surfaces can be made through the use of partially cured, low shrinkage glues to hold the smart card's electronic elements during their immersion in a thermosetting material that becomes the core layer of said cards. Mounds of low shrinkages give serve to hold the electronic component in a given position in the core layer.

7 Claims, 8 Drawing Sheets

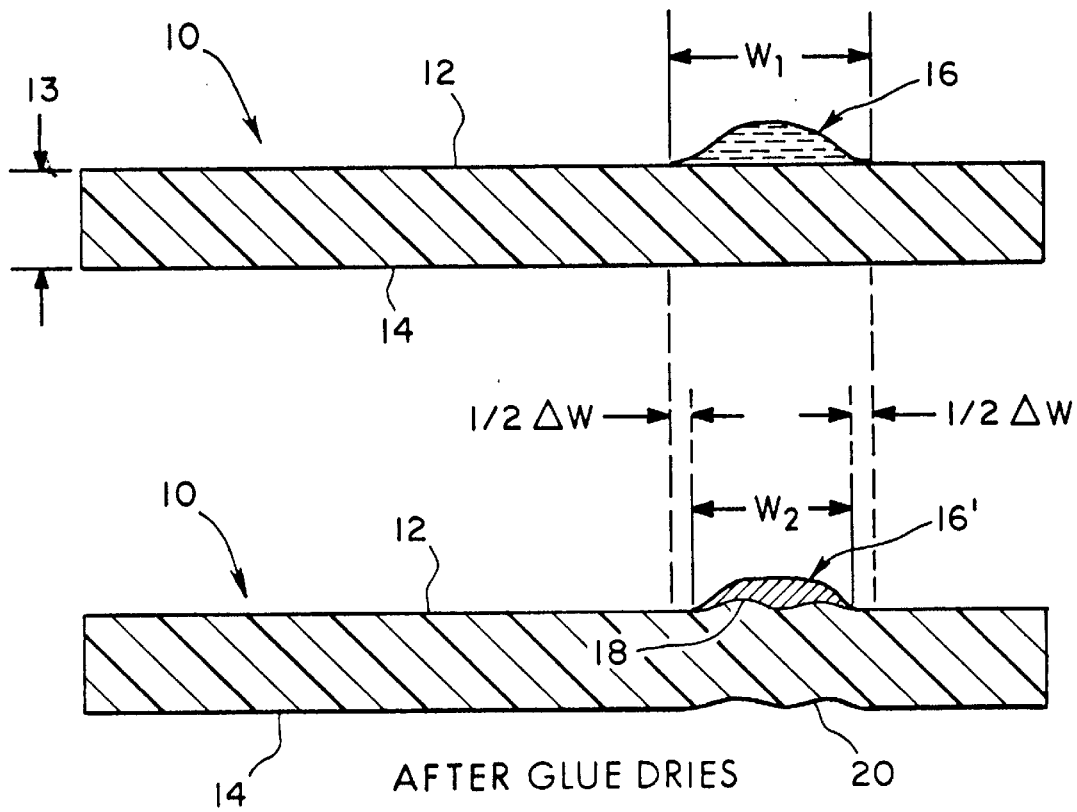
Fig. 1(a)
(Prior Art)
BEFORE GLUE DRIES
AFTER GLUE DRIES
Fig. 1(b)
(Prior Art)
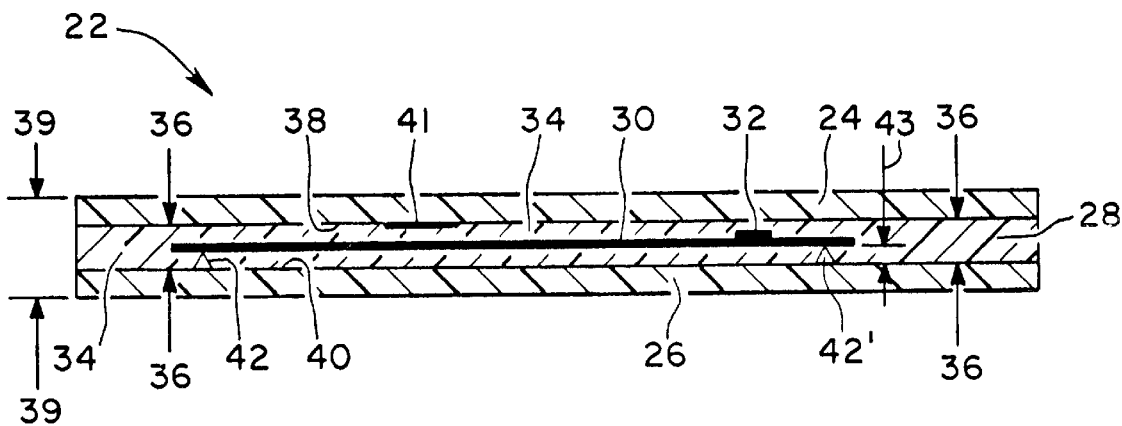
Fig. 2

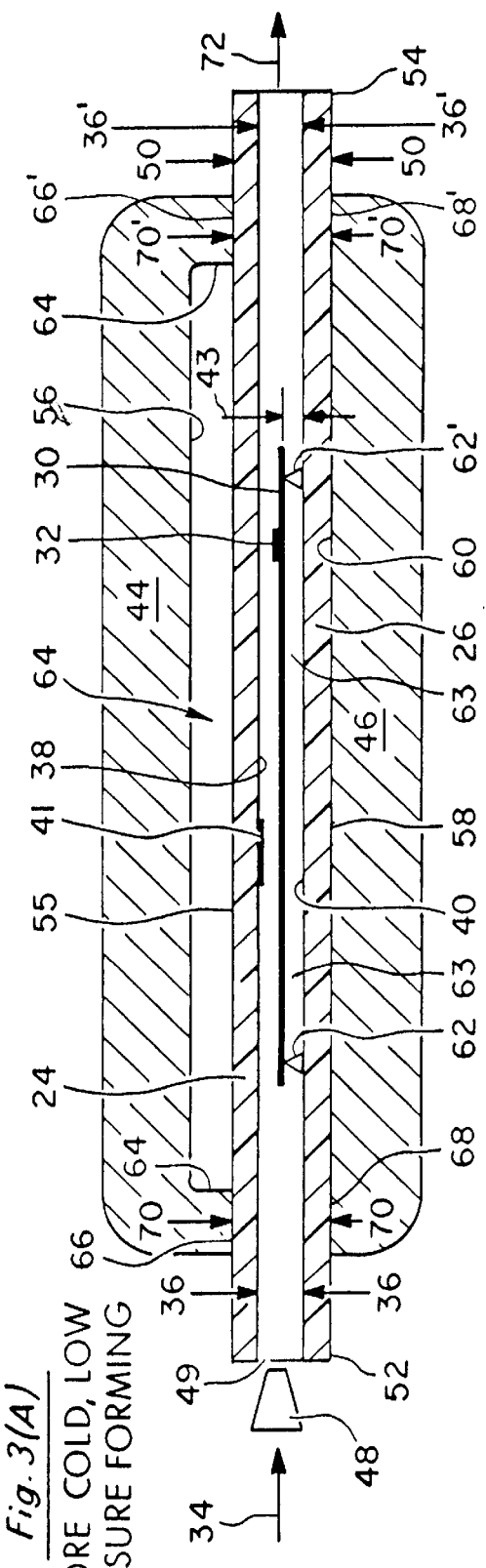
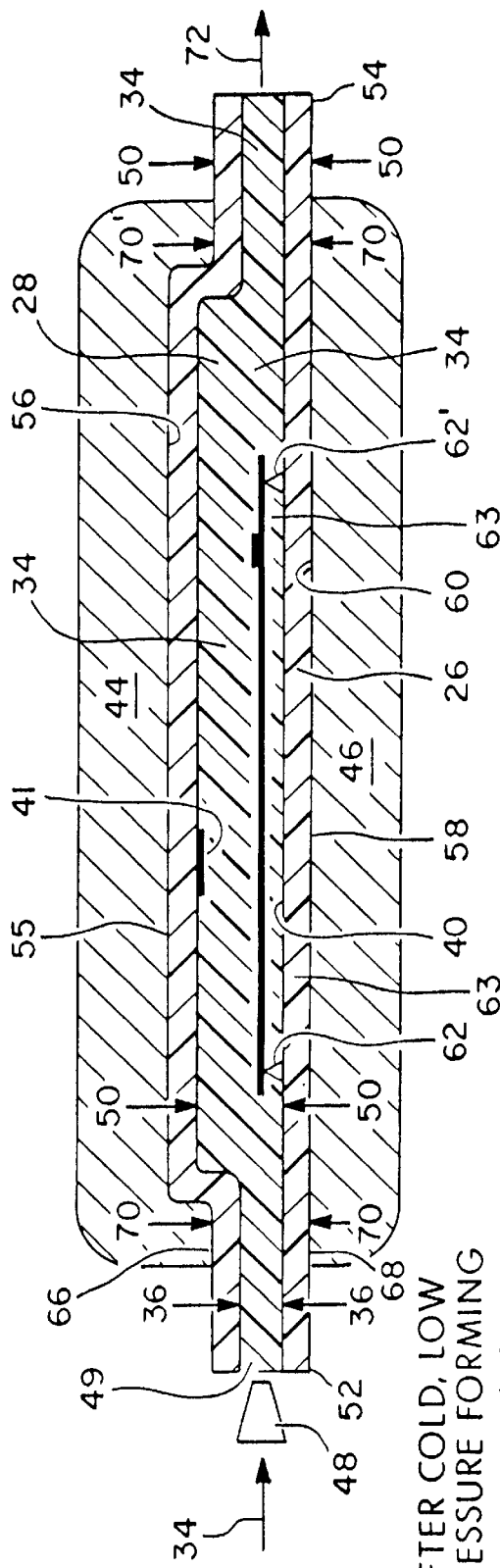
Fig. 3(A) BEFORE COLD, LOW PRESSURE FORMING
Fig. 3(B) AFTER COLD, LOW PRESSURE FORMING

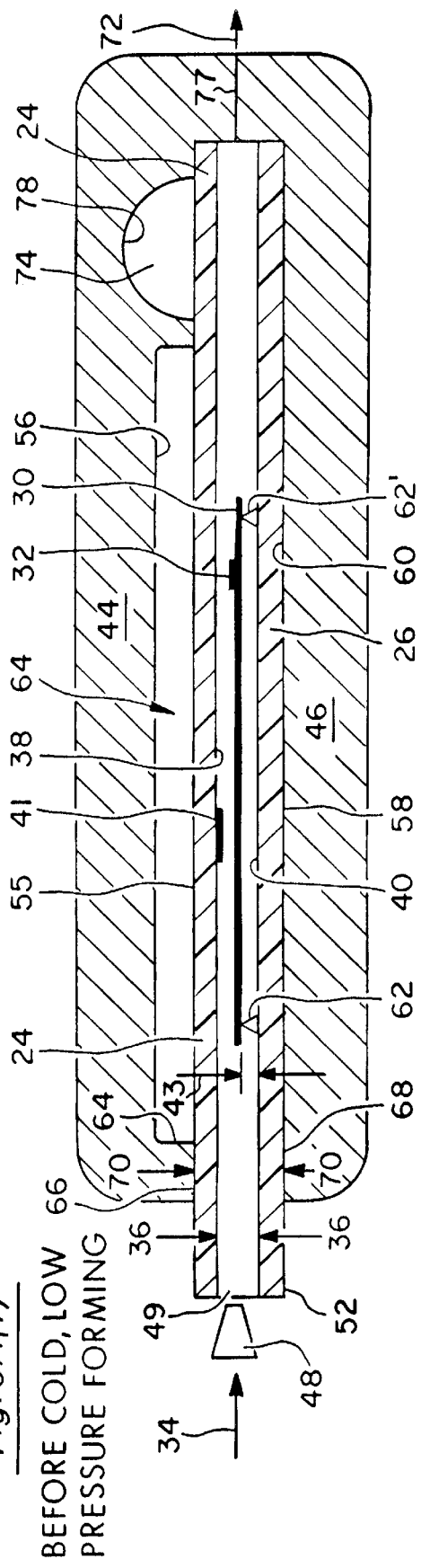
Fig. 3A(1)
BEFORE COLD, LOW
PRESSURE FORMING
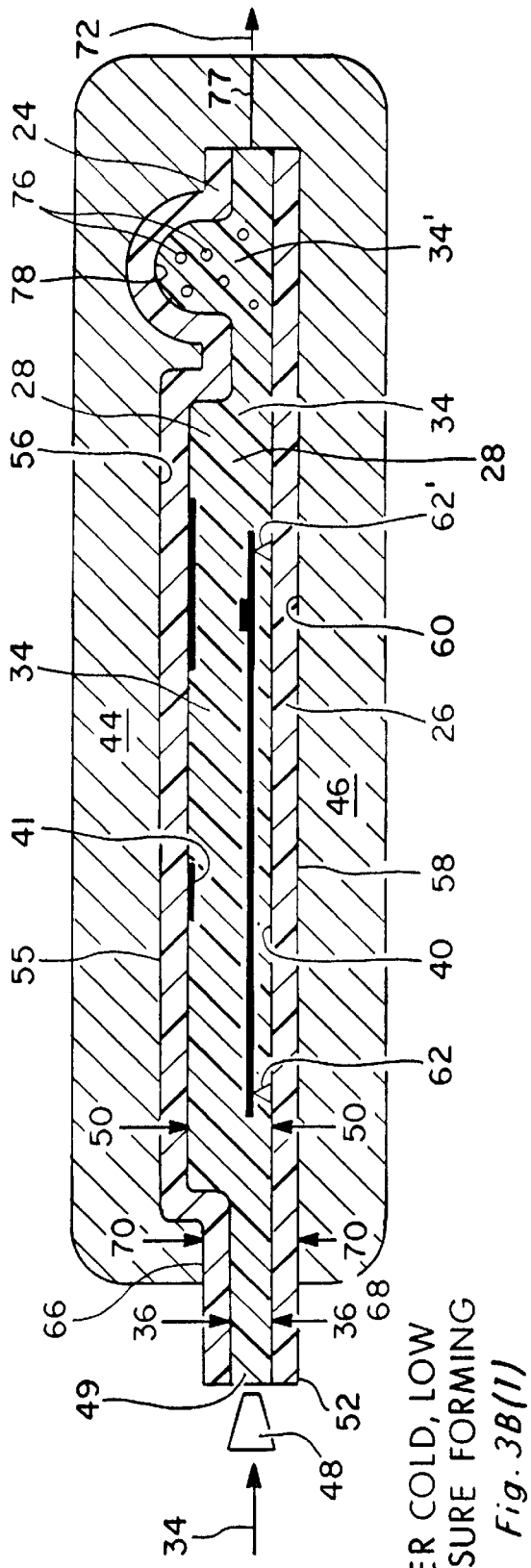
Fig. 3B(1)
AFTER COLD, LOW
PRESSURE FORMING

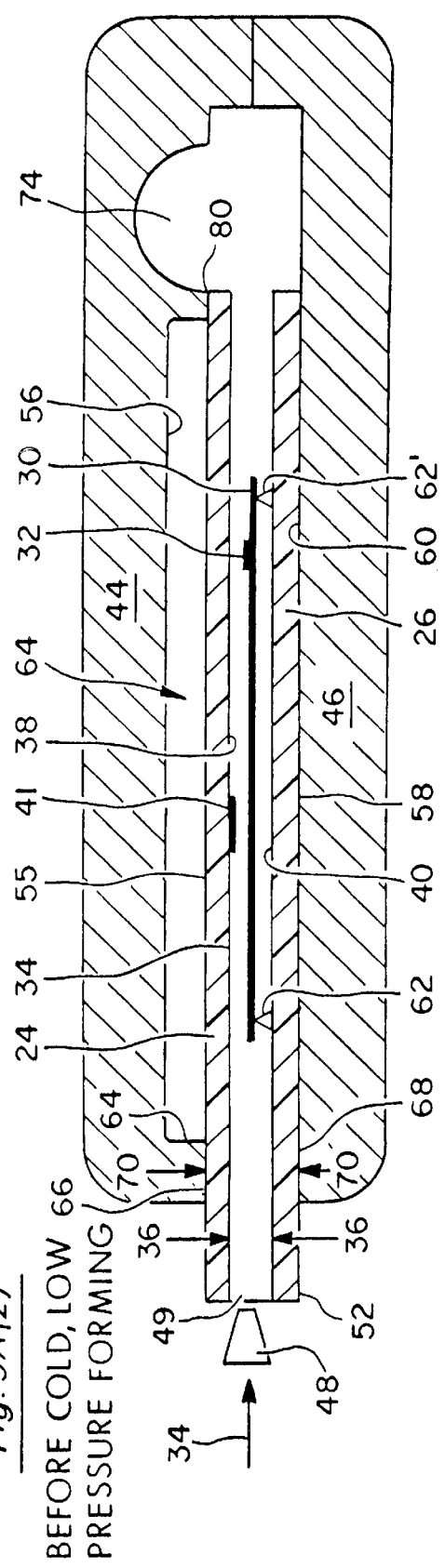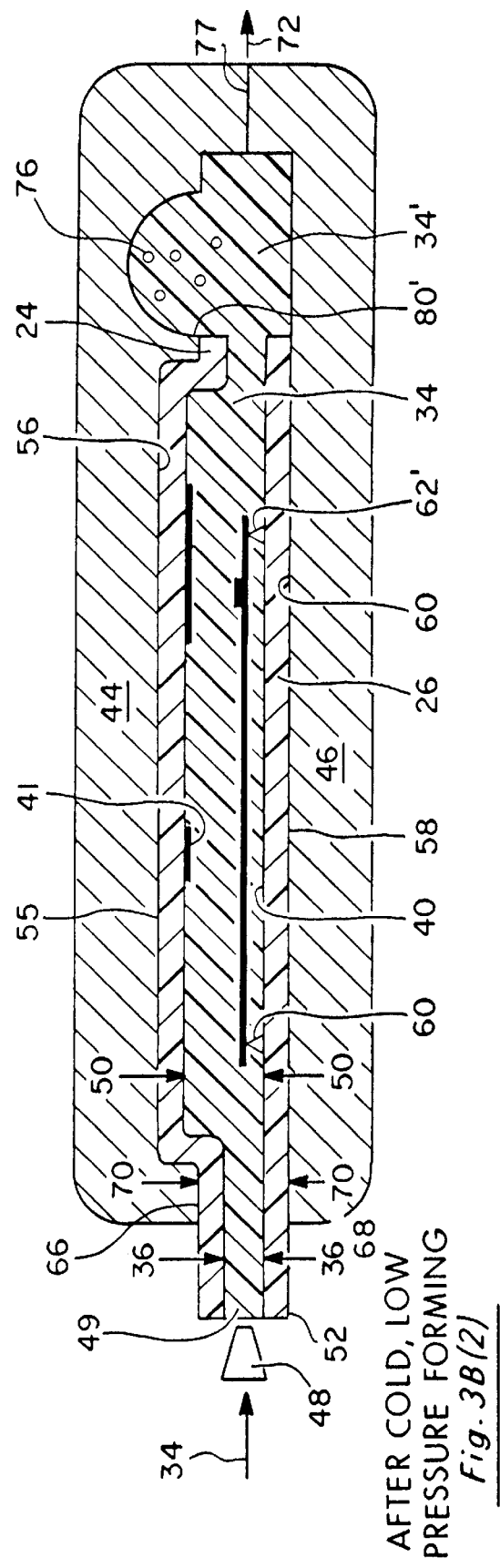
Fig. 3A(2) BEFORE COLD, LOW PRESSURE FORMING
Fig. 3B(2) AFTER COLD, LOW PRESSURE FORMING

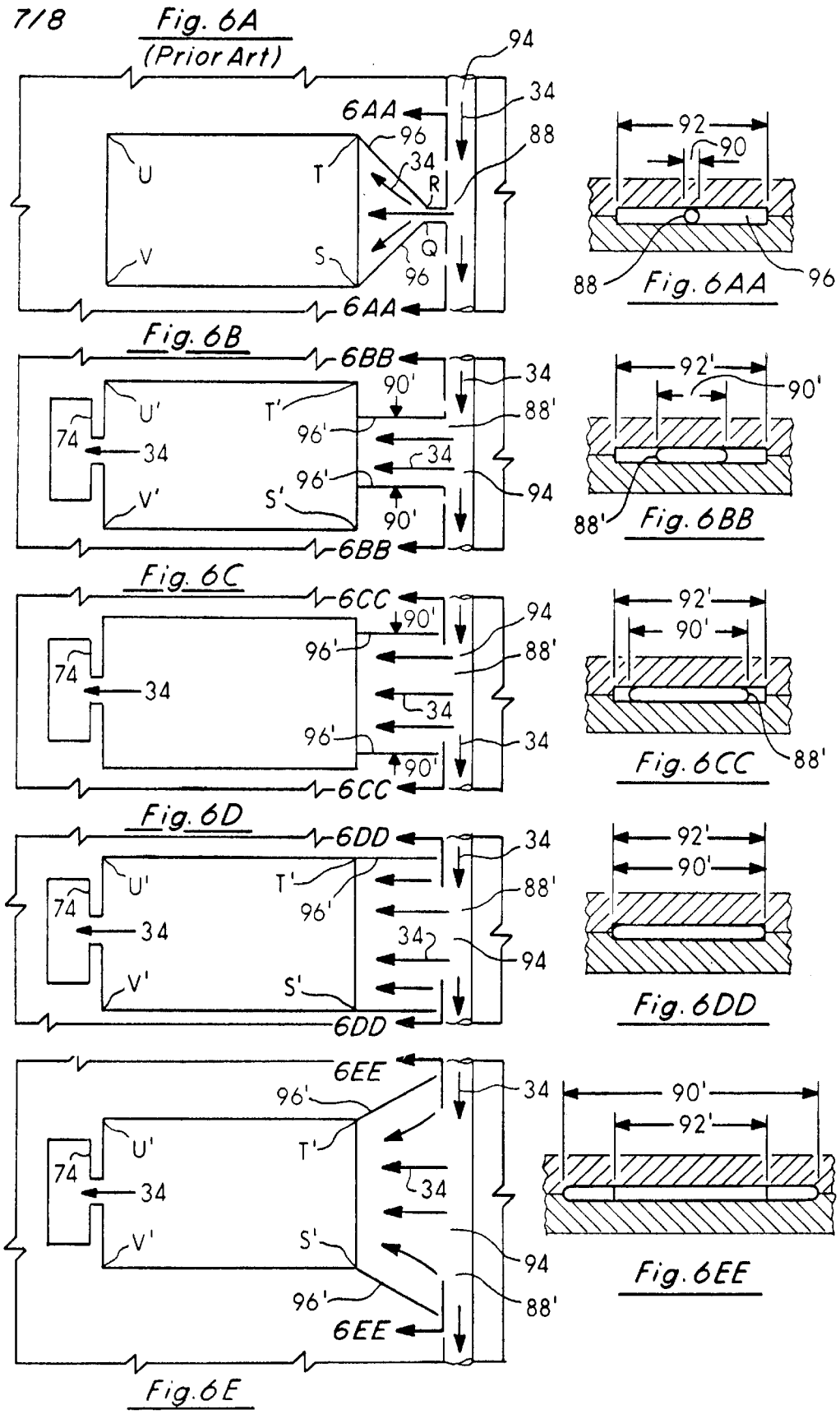

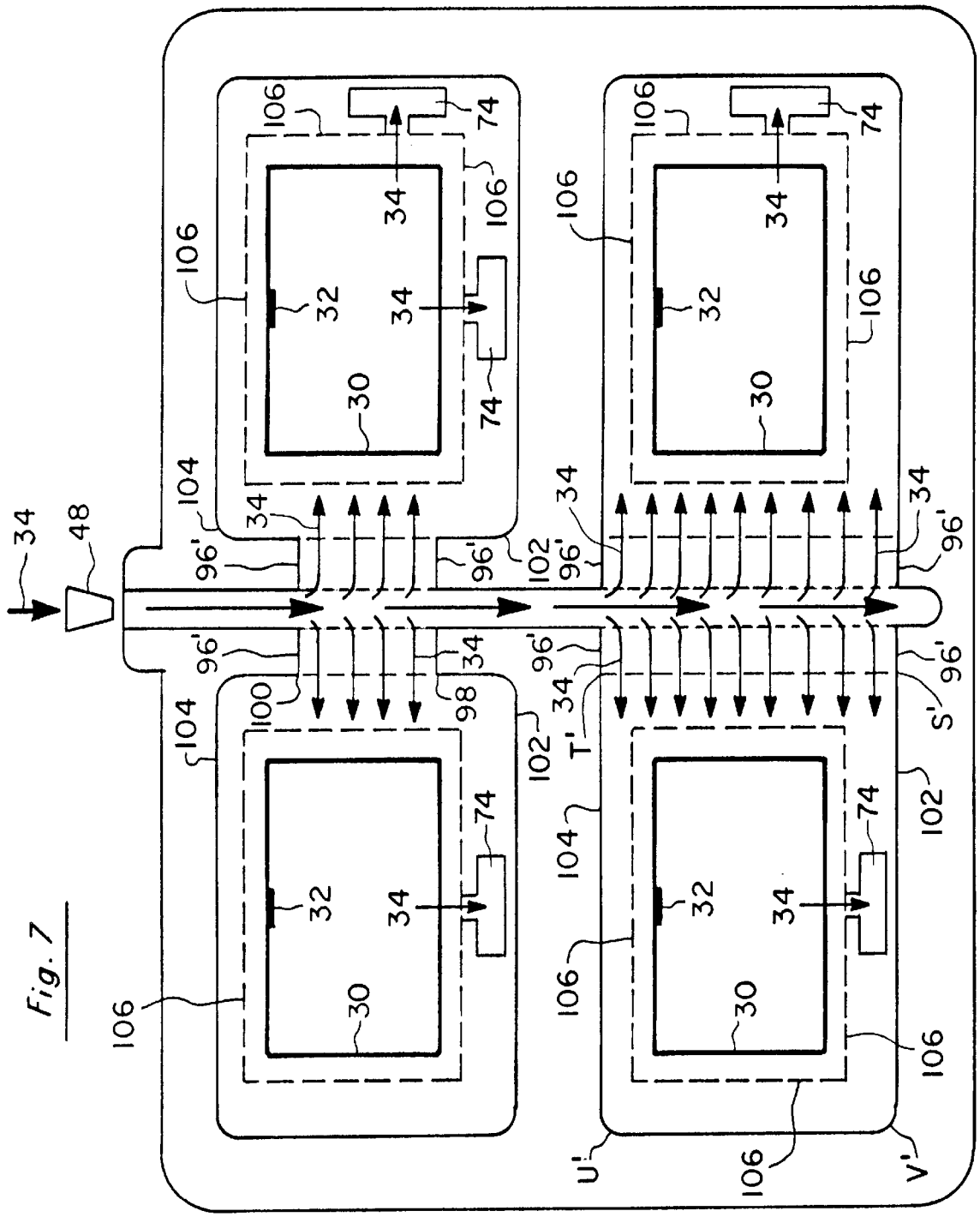

6,025,054

SMART CARDS HAVING GLUE-POSITIONED ELECTRONIC COMPONENTS

RELATED APPLICATIONS

This patent application is a divisional patent application of U.S. patent application Ser. No. 08/925,593 entitled "Method for Making Smart Cards" filed on Sep. 8, 1997, now U.S. Pat. No. 5,955,021 and which, in turn, claims the benefit of, and claims the filing date of, Provisional Application 60/048,704, entitled Provisional Patent Application for Method for Making Smart Cards, filed May 19, 1997.

BACKGROUND OF THE INVENTION

Smart cards are used as bankcards, ID cards, telephone cards and the like. They are based upon the use of an electromagnetic coupling (either by direct physical contact or by electromagnetic waves) between the smart card's electronic components and a card reader or other receiving device. Such couplings may be used to effect a reading mode alone or a read/write mode. Such cards are usually made by assembling several layers of plastic sheets in a sandwich array. In the case of so-called "contactless" smart cards (i.e., those smart cards whose electronic components are contacted by electromagnetic waves rather than by physical contact), a center layer of a polymerizable resin totally encapsulates an electronic module that may, for example, comprise an 1C chip that is connected to an inductive coil type antenna that is capable of receiving electromagnetic waves through the body of the card.

The methods for making smart cards have varied considerably. For example, European Patent 0 350 179 discloses a smart card wherein electronic circuitry is encapsulated in a layer of plastic material that is introduced between the card's two surface layers. The method further comprises abutting a high tensile strength holding member against a side of a mould, locating the smart card's electronic components with respect to that side and then injecting a reaction moldable polymeric material into the mould such that it encapsulates the electronic components.

European Patent Application 95400365.3 teaches a method for making contactless smart cards. The method employs a rigid frame to position and fix an electronic module in a void space between an upper thermoplastic sheet and a lower thermoplastic sheet. After the frame is mechanically affixed to the lower thermoplastic sheet, the void space is filled with a polymerizable resin material.

U.S. Pat. No. 5,399,847 teaches a credit card that is comprised of three layers, namely, a first outer layer, a second outer layer and an intermediate layer. The intermediate layer is formed by injection of a thermoplastic binding material that encases the smart card's electronic elements (e.g., an IC chip and an antenna) in the intermediate layer material. The binding material is preferably made up of a blend of copolyamides or a glue having two or more chemically reactive components that harden upon contact with air. The outer layers of this smart card can be made up of various polymeric materials such as polyvinyl chloride or polyurethane.

U.S. Pat. No. 5,417,905 teaches a method for manufacturing plastic credit cards wherein a mold tool comprised of two shells is closed to define a cavity for producing such cards. A label or image support is placed in each mold shell. The mold shells are then brought together and a thermoplastic material injected into the mold to form the card. The inflowing plastic forces the labels or image supports against the respective mold faces.

U.S. Pat. No. 5,510,074 teaches a method of manufacturing smart cards having a card body with substantially parallel major sides, a support member with a graphic element on at least one side, and an electronic module comprising a contact array that is fixed to a chip. The manufacturing method generally comprises the steps of: (1) placing the support member in a mold that defines the volume and shape of the card; (2) holding said support member against a first main wall of the mold; (3) injecting a thermoplastic material into the volume defined by the hollow space in order to fill that portion of the volume that is not occupied by the support member; and (4) inserting an electronic module at an appropriate position in said thermoplastic material before the injected material has the opportunity to completely solidify.

U.S. Pat. No. 4,339,407 discloses an electronic circuit encapsulation device in the form of a carrier having walls which have a specific arrangement of lands, grooves and bosses in combination with specific orifices. The mold's wall sections hold a circuit assembly in a given alignment. The walls of the carrier are made of a slightly flexible material in order to facilitate insertion of the smart card's electronic circuitry. The carrier is insertable into an outer mold. This causes the carrier walls to move toward one another in order to hold the components securely in alignment during the injection of the thermoplastic material. The outside of the walls of the carrier has projections thereon which serve to mate with detents on the walls of the mold in order to locate and fix the carrier within the mold. The mold also has holes to permit the escape of trapped gases.

U.S. Pat. No. 5,350,553 teaches a method of producing a decorative pattern on, and placing an electronic circuit in, a plastic card in an injection molding machine. The method comprises the steps of: (a) introducing and positioning a film (e.g., a film bearing a decorative pattern), over an open mold cavity in the injection molding machine; (b) closing the mold cavity so that the film is fixed and clamped in position therein; (c) inserting an electronic circuit chip through an aperture in the mold into the mold cavity in order to position the chip in the cavity; (d) injecting a thermoplastic support composition into the mold cavity to form a unified card; and (e) thereafter, removing any excess material, opening the mold cavity and removing the card.

U.S. Pat. No. 4,961,893 teaches a smart card whose main feature is a support element that supports an integrated circuit chip. The support element is used for positioning the chip inside a mold cavity. The card body is formed by injecting a plastic material into the cavity so that the chip is entirely embedded in the plastic material. In some embodiments, the edge regions of the support are clamped between the load bearing surfaces of the respective molds. The support element may be a film which is peeled off the finished card or it may be a sheet which remains as an integral part of the card. If the support element is a peel-off film, then any graphics elements contained therein are transferred and remain visible on the card. If the support element remains as an integral part of the card, then such graphics elements are formed on a face thereof and, hence, are visible to the card user.

U.S. Pat. No. 5,498,388 teaches a smart card device that includes a card board having a through opening. A semiconductor module is mounted onto this opening. A resin is injected into the opening so that a resin molding is formed under such condition that only an electrode terminal face for external connection of said semiconductor module is exposed. The card is completed by mounting a card board having a through opening onto a lower mold of two opposing molding dies, mounting a semiconductor module onto the opening of said card board, tightening an upper die that has a gate leading onto a lower die and injecting a resin into the opening via the gate.

U.S. Pat. No. 5,423,705 teaches a disc having a disc body made of a thermoplastic injection molded material and a laminate layer that is integrally joined to a disc body. The laminate layer includes an outer clear lamina and an inner white and opaque lamina. An imaging material is sandwiched between these lamina.

All of these prior art methods for making smart cards are to some degree concerned with properly positioning and fixing electronic components, modules or assemblies inside the smart card. If the electronic components are not properly affixed they will be moved to random positions when a thermoplastic material is injected into a card-forming, or card core-forming, cavity under the influence of rather high thermoset material injection pressures. The prior art noted above reveals use of various solid holding members such as frames or supports that are often used to position and fix the electronic elements during the thermoplastic injection processes. The use of relatively large, mechanical holding devices having hard, sharply defined, bodies to hold their electronic components in place during injection of such thermosetting materials has, however, created certain problems. For example, the bodies of these relatively large holding devices (i.e., large relative to the electronic components they hold) are often adversely effected by those shock, flexure and/or torsion forces the card may encounter in normal (and abnormal) use. In order to minimize the damage caused by such forces, the electronic components held by some of these hard, sharply defined bodies are often positioned in a corner of such smart cards. This positioning limitation usually cuts down on the size and number of electronic components that can be placed in such cards.

Moreover, due to differences in the coefficient of expansion of the materials used to make these relatively large holding devices—relative to the coefficient of expansion of the other elements of such cards—deformations often appear on the external surfaces of finished cards that contain such electronic component holding devices. That is to say that surface deformations can result from the mere presence of such holding members in the body of the card as it experiences different temperatures and pressures during its manufacture. Such deformations are, at best, unsightly; at worst, they may even prevent the card from lying completely flat in the card-receiving receptacles in certain card reading machines.

Some smart card manufacturers have dealt with this problem by reducing the size and/or body of such holding devices by using various glues (rather than mechanical interconnecting locking devices) to securely position their holders (and hence the electronic component that they hold) in their cardforming cavities during the thermoplastic injection process. The use of such glues to secure these holder devices has, however, produced another set of problems. They usually revolve around the fact that most commercially available, fast curing glues that are used to fix such electronic component holders in place also are often characterized by their high degrees of shrinkage. Moreover, relatively large volumes of glue are needed to fix these relatively large holders when they are impinged upon by the incoming thermoset material. Use of the relatively large volumes of high shrinkage glues needed to fix these holders in place tends to wrinkle and otherwise deform the region of a plastic sheet or layer to which such glues are applied. Worse yet, the forces created by these wrinkle-like deformations on the inside surfaces of the plastic sheets (e.g., sheets of polyvinyl chloride) used to make a smart card's surface layer(s) are transmitted through the relatively thin (e.g., from about 0.075 to about 0.25 mm) bodies of these sheet materials. These forces often cause the outer surface of the smart card to take on a local wave-like, bent, or even wrinkled, character. Beyond certain tolerances, these wave-like, bent, or wrinkle-like deformations are unacceptable to the smart card industry. Hence, many techniques have been developed to try to at least minimize deformities of this kind. Unfortunately, such deformations continue to be a problem—especially when smart cards are made using various high speed gluing methods to glue these relatively large holder devices to the thin sheets of the plastic materials (e.g., PVC) that form the outside surfaces of most smart cards.

SUMMARY OF THE INVENTION

Applicant's smart cards (e.g., credit cards, personal identity cards, access control, telephone cards, etc.) and methods for making them are primarily based upon the use of certain hereinafter more fully described glues and gluing procedures. The beneficial effects of applicant's glues and gluing procedures, however, can be augmented and enhanced by the use of certain other specific materials and manufacturing methods. For example, the beneficial effects of applicant's glues and gluing procedures may be further enhanced by use of (1) certain hereinafter more fully described "cold," "low pressure," forming procedures, (2) certain placements of the electronic components within these smart cards, (3) certain thermoset flow gate geometries and (4) certain receptacles in applicant's molds for receiving thermoset material that may be injected in excess of the amount needed to form the core regions of applicant's smart cards. In any case, applicant's smart cards are particularly characterized by their high quality external surfaces. The term "high quality" in the context of this patent disclosure should be taken to imply a substantially flat surface (i.e., a surface having no waves, bends, wrinkles or pock marks).

Applicant's smart cards are comprised of a top layer having an inside surface and an outside surface, a bottom layer having an inside surface and an outside surface and a center or core layer that is sandwiched between the top and bottom layers. All three of these layers are unified into a smart card body by bonding action between the thermosetting polymeric material used to create the core layer and the material(s) out of which the top and bottom layers are made. In some preferred embodiments of applicant's invention, this bonding action may be augmented through use of various hereinafter more fully described treatments of the inside surface of the top and/or bottom layers.

The electronic components (e.g., computer chip, antenna, capacitor, etc.) of applicant's smart cards are embedded in the thermosetting polymeric material that constitutes the card's center or core layer. Hence, these electronic components form no part of the external surface of applicant's finished smart cards. Again, cards of this kind are often referred to as "contactless" smart cards. They communicate through electromagnetic waves that are received (and in some cases even transmitted) through the body of the smart card via its antenna component. For wide commercial use, such smart cards must be made to very precise, standardized dimensions. For example, ISO Standard 7810 requires that they have a nominal length of 85.6 mm, a nominal width of 53.98 mm and a nominal thickness of 0.76 mm.

Before delving any further into the details of applicant's methods for making the hereindescribed smart cards, it should be first noted that for the purposes of this patent disclosure the terms "upper" and "lower," or "top" and "bottom," layer(s) should be regarded as being relative. That is to say that they are implied by the relative positions of the mold shells that are employed to manufacture these cards. Hence, these terms should not imply any absolute position or orientation. Applicant does, however, have certain relative position preferences for making the smart cards of this patent disclosure. For example, since the use of certain liquid or semi-liquid glues plays an especially important role in the hereindescribed processes, the term "bottom" may in some uses imply certain positional preferences. For example, applicant's glues are preferably used to position the card's electronic components (antenna, chip, capacitor, etc.) on the "top surface" of a sheet of material (e.g., PVC) that eventually becomes the "bottom layer" of the card. This preference is in deference to the effects of gravity on applicant's liquid or semi-liquid glues when they are first laid down or otherwise dispensed.

Be this top/bottom nomenclature as it may, the hereindescribed methods for making contactless smart cards will employ reaction injection molding machines (which are often individually referred to as "RIM"). These machines are associated with a top mold shell and a bottom mold shell that are capable of performing certain hereinafter more fully described cold, low pressure, forming operations on at least one of the sheets of polymeric material (e.g., PVC) that make up the two major external surface layers of applicant's smart cards. Such top and bottom mold shells cooperate in ways that are well known to those skilled in the polymeric material molding arts. For use in applicant's particular processes, however, at least one of the RIM's mold shells, e.g., the top mold shell, will have at least one cavity for partially defining the thickness of, and general peripheral extent of, a precursor smart card body that is to be cold, low pressure formed between the two mold shells.

It might also be noted here that applicants use of the term "precursor smart card body" (which will include bodies of "excess" polymeric material) is to distinguish those roughly defined card bodies that are formed by such mold devices from those "finished" smart cards that are produced by removing the excess polymeric materials (e.g., by trimming them off of the precursor card body) and by cutting the precursor card bodies to certain prescribed sizes (e.g., 85.6 mm by 53.98 mm as per ISO Standard 7810) for any given finished product smart card. Such cutting to prescribed sizes also may remove the excess material in one cutting/trimming operation. It also will be well appreciated by those skilled in this art that the molding devices used to make such cards in commercial production operations will most preferably have mold shells having multiple cavities (e.g., 2, 4, 6, 8, etc.) for making several such cards simultaneously.

Those skilled in this art also will appreciate that applicant's use of terms like "polymeric," "plastic," "thermoplastic" and "thermosetting" each refer to a potentially wide variety of materials.

Be that as it may, the polymeric materials employed by applicant will generally fall into one of two subcategories—thermoplastic materials or thermosetting materials. Thermoplastic materials (such as their cover materials) consist of long molecules (either linear or branched) having side chains or groups that are not attached to other polymer molecules. Consequently, thermoplastic materials can be repeatedly softened and hardened by heating and cooling so they can be formed, and then cooled so that they harden into a final desired shape. Generally speaking, no appreciable chemical changes take place during such heat driven, forming operations. Conversely, thermosetting materials (such as their resins), have chemically reactive portions that form chemical cross-linkages between their long molecules during their polymerization. These linear polymer chains become bonded together to form stereo chemical structures. Therefore, once such thermosetting resins are hardened, the resulting material cannot be softened by heating without degrading at least some of these chemical cross linkages.

Either form of polymeric material (thermoplastic or thermosetting) may be used for the top layer and/or the bottom layer of applicant's smart cards. Hence, applicant's use of the general term "polymeric" with respect to the materials out of which applicant's top and bottom layers can be made should be taken to include thermosetting materials as well as thermoplastic materials. Thermosetting polymers are, however, highly preferred for creating the center or core layer of applicant's smart cards. There are several reasons for this reference. For example, thermoset polymers generally bond with the materials (e.g., PVC) from which the top and bottom layers are preferably made. Thermoset polymers also can be commercially obtained in easy to use, liquid monomer-polymer mixtures, or partially polymerized molding compounds, that are particularly well suited for use in applicant's cold, low pressure forming operations.

Some representative polymeric materials (thermoplastic or thermosetting) that can be used for making applicant's top and bottom layers will include polyvinyl chloride, polyvinyl dichloride, polyvinyl acetate, polyethylene, polyethylene-terephthalate, polyurethane, acrylonitrile butadiene styrene, vinyl acetate copolymer, polyesters, polyethylene, epoxy and silicones. Such top and bottom layers also may be made from other polymeric materials such as polycarbonate, cellulose acetate and cellulose acetate butyrate-containing materials. Of all the polymeric materials from which applicant's top and bottom layers could be made, however, polyvinyl chloride is especially preferred because of the clear to opaque visual qualities of this material and its ability to receive printing and its relatively lower cost.

The most preferred thermosetting materials for applicant's injection purposes are polyurethane, epoxy and unsaturated polyester polymeric materials. By way of some more specific examples, polyurethanes made by condensation reactions of isocyanate and a polyol derived from propylene oxide or trichlorobutylene oxide are especially preferred. of the various polyesters that can be used in applicant's processes, those that can be further characterized as being "ethylenic unsaturated" are particularly preferred because of their ability to be cross linked through their double bonds with compatible monomers (also containing ethylene unsaturation) and with the materials out of which applicant's top and bottom layers are made. The more preferred epoxy materials for use in the practice of this invention will be those made from epichlorohydrin and bisphenol A, or epichlorohydrin, and an aliphatic polyol (such as glycerol). They are particularly preferred because of their ability to bond with some of the more preferred materials (e.g., polyvinyl chloride) out of which applicant's top and bottom layers are made. These three general kinds of thermosetting material, (polyurethane, epoxy and unsaturated polyester), also are preferred because they do not tend to chemically react with applicant's more preferred glues (e.g., various cyanoacrylate-based glues), to form unsightly "artifacts" in the core regions of applicant's card bodies.

Next, it should be noted that applicant's use of expressions such as "cold, low pressure forming conditions" generally should be taken to mean forming conditions wherein the temperature of the injected polymeric liquid or semi-liquid material is less than the heat distortion temperature of the plastic sheet material being cold formed (e.g., the top layer of applicant's smart cards), and pressures less than about 500 psi. In some of the more preferred embodiments of the hereindescribed processes, the cold forming temperatures used in applicant's processes will be at least 100° F. less than the heat distortion temperature of the plastic sheet material being molded. By way of a more specific example, the heat distortion temperature of many polyvinyl chloride (PVC) materials is about 230° F. Hence, the temperatures used to cold form such PVC sheets in applicant's process preferably will be no more than about (230° F.–100° F.) 130° F.

Applicant's more preferred cold, low pressure forming procedures will involve injection of thermosetting polymeric materials whose temperatures range from about 56° F. to about 160° F., under pressures that preferably range from about atmospheric pressure to about 500 psi. More preferably, the temperatures of the thermosetting polymers being injected into the center or core region of applicant's cards will be between about 65° F. and about 70° F. under injection pressures that preferably range from about 80 to 120 psi. In some of the most preferred embodiments of this invention the liquid or semi-liquid thermosetting polymeric material will be injected into any given card forming cavity under these preferred temperature and pressure conditions at flow rates ranging from about 0.1 to about 50 grams/second/card-forming cavity. Flow rates of 1.5 to 1.7 grams/seconds/card-forming cavity are even more preferred. Those skilled in this art also will appreciate the applicant's low temperature and pressure conditions contrast rather sharply with the much higher temperatures (e.g., 200° F. to 1000° F.) and pressures (e.g., from 500 to 20,000 psi) used in many prior art, high speed, smart card lamination or injection molding manufacturing operations.

Next, it should be noted that applicant's use of such relatively cold, low pressure, forming conditions may require that any given gate (i.e., the passageway that connects a runner with each individual card-forming cavity) be larger than those gates used in prior art, hot, high pressure operations. Applicant's gates are preferably relatively larger than prior art gates so that they are able to quickly pass the thermoset material being injected under applicant's cold, low pressure forming conditions. Similarly, the runner (i.e., the main thermoset material supply passageway in the mold system that feeds from the source of the thermoset material to each individual gate), will normally be in a multi-gate or manifold array, and, hence, should be capable of simultaneously supplying the number of gates/card forming cavities (e.g., 4 to 8 cavities) in the manifold system at the relatively cold temperature (e.g., 56° F. to 160° F.) and relatively low pressure (e.g., atmospheric pressure to 500 psi) conditions used in applicant's process. It also might be noted at this point that the flow rates for the polymeric thermoset material under applicant's low temperature and pressure conditions nonetheless, should be such that they are able to completely fill a given card-forming cavity in less than or about 10 seconds per card-forming cavity (and more preferably in less than about 3 seconds). Card-forming cavity fill times of less than 1 second are even more preferred. In view of these conditions, certain preferred embodiments of applicant's smart card making processes will employ gates having a width which is a major fraction of the length of a leading edge of the card to be formed (that is, a card edge which is connected to a gate). Applicant prefers that the width of a given gate be from about 20 percent to about 200 percent of the width of the leading edge (or edges—multiple gates can be used to fill the same card-forming cavity), i.e., the "gated" edge(s), of the smart card being formed.

Applicant also prefers to employ gates that are tapered down from a relatively wide inflow area to a relatively narrow core region that ends at or near the leading edge(s) of the card body being formed. Most preferably, these gates will narrow down from a relatively wide diameter (e.g., from about 5 to about 10 mm) injection port that is in fluid connection with the thermosetting material-supplying runner, to a relatively thin diameter (e.g., 0.10 mm) gate/card edge where the gate feeds the thermosetting material into the void space which ultimately becomes the center or core of applicant's finished card. By way of further example, applicant has found that gates that taper from an initial diameter of about 7.0 millimeters down to a minimum diameter of about 0.13 mm will produce especially good results under applicant's preferred cold, low pressure injection conditions.

Another optional feature that can be used to advantage along with applicant's glues and gluing procedures is the use of mold shells that have one or more receptacles for receiving "excess" polymeric material that may be purposely injected into the void space between applicant's top and bottom layers in order to expunge any air and/or other gases (e.g., those gases formed by the exothermic chemical reactions that occur when the ingredients used to formulate most polymeric thermoset materials are mixed together) from said void space. These thermoset ingredients are preferably mixed just prior to (e.g., about 30 seconds before) their injection into the void space.

Still other optional procedures that may be used to enhance the results of using applicant's glues and gluing methods may include the use of: (1) treatments that encourage and/or augment the bonding action between the inside surfaces of the top and bottom layers and the injected thermosetting material, (2) films that display alphanumeric/graphic information that is visible at the card's major surface(s), (3) opacity promoting (or preventing) films or layers, (4) use of top layers or bottom layers that are at least partially pre-molded by a preceding molding operation (e.g., a preceding, prior art type, "hot" molding operation or a preceding "cold" molding operation such as those described in this patent disclosure and (5) the use of opacity promoting pigment(s) in the thermoset material. It might also be noted here that the outside surfaces of the smart cards resulting from applicant's manufacturing processes may be thereafter embossed or printed upon in order to display alphanumeric/graphic information.

The glues used in the hereindescribed processes are best characterized as "low shrinkage" glues. At this point it might also be noted that the amount of "curing" (which is usually associated with an amount of "shrinkage") of a given glue can be measured, or at least approximated, in several ways. For example, the degree of curing of a glue is often measured by the glue's decrease in volume. The amount of curing also is often measured by the increase in density that the glue undergoes as a result of curing. Regardless of the method used to measure these phenomena, applicant's use of the term "low shrinkage glue" may be taken to mean a glue that does not decrease in volume (or increase in density) by more than 15 percent.

Applicant has found that some of the more preferred glues that best meet his "low shrinkage" requirements will include (but not be limited to) certain cyanoacrylate adhesives (that are often referred to as "CAs") and certain so-called "UV curable" glues. For example, applicant has found that various CA's will cure in less than about 40 seconds (and in some cases in less than about 5 seconds) by merely being exposed to the atmosphere. Such glues also will "partially cure" in from 0.1 to about 5.0 seconds to an extent that an electronic component that has been associated with the partially cured glue will remain in place while it is being immersed in a thermosetting material under the cold, low pressure conditions employed in applicant's processes. Indeed, as used in this patent disclosure, the expression "partially cured glue" can be taken to mean a glue that is capable of holding an electronic component or an electronic component-containing assembly in position during the thermoset polymer injection step of applicant's overall process—but which also experiences further curing upon being immersed in the thermoset polymer.

This partial curing will usually be evidenced by formation of a "skin" around the body of freshly dispensed low shrinkage, glue. That is to say that such a skin will surround a still semi-liquid body of low shrinkage glue while it is in such a partially cured state. A more detailed description of many such CA type glues is given in a technical data publication "Pronto™ and Pronto Plus™ Instant Adhesives" published in May 1996 by 3M Adhesive Systems Industrial Tape and Specialties Division, 3M Center, Building 220-7E-01, St. Paul, Minn. 55144-1000 and said publication is hereby incorporated into this patent disclosure.

Various other kinds of glues may be used in applicant's processes as well. Many, however, may need to be at least partially cured by exposure to an "artificial" energy source (i.e., an energy source other than ambient heat and/or light). For example such an artificial energy source may be characterized by its ability to produce electromagnetic waves of a given wave length. Some glues, for example, can be more quickly cured by exposure to energy sources giving off electromagnetic waves having wave lengths ranging from about 200 to about 400 nanometers (nm). Such glues are often referred to as "UV curable glues". Electrically powered UV and/or microwave producing devices known to those skilled in this art may be employed as sources of such 200–400 nm wave forms. Use of devices that emit 260–270 nm wave forms is even more preferred when using some of these UV curable glues.

Of the many UV curable, low shrinkage, glues that may be used in applicant's processes, those having acrylate components are particularly preferred. Acrylate containing glues that are based in urethanes may be particularly useful in some of applicant's processes. For example, a urethane based acrylate glue produced by Loctite Corporation of Rocky Hill, Conn., under their designation Loctite 3104®, may be used to considerable advantage.

Regardless of the type of glue being used, applicant's "partial curing" step will most preferably take place in a period of time ranging from about 0.1 to about 5.0 seconds. Partially curing times of less than 3 seconds are even more preferred. Regardless of the relative quickness of these partial curing processes, however, applicant's low shrinkage glues should, most preferably, be employed in the form of at least one small mound, or dollop, or hemisphere on an inside surface of the bottom layer (or top layer) of applicant's smart cards. Such glue mound(s) also may be applied to an electronic component which is then glued in a given place on an inside surface of the card's bottom (or top) layer. In some even more preferred embodiments of applicant's processes, two or more such mounds of glue will be employed to support two regions of an antenna component of an assembly or module of electronic components of which the antenna is an element. In these more preferred embodiments, the two or more mounds of glue will support an electronic component (e.g., an antenna) in a "pedestal-like" fashion above the surface of the layer (e.g., the bottom layer) to which the glue is applied. When such glues are dispensed (e.g., as droplets) on the inside surface of a bottom layer, they generally will, under the influence of gravity and surface tension phenomena, assume a mound-like or hemisphere-like configuration.

In these more preferred embodiments, the volumes of these mounds of glue will be very small (e.g., less than 1 cc and preferably less than 0.1 cc and most preferably between about 0.01 cc and about 0.001 cc). It also might be noted here that the volumes of glue needed to secure applicant's electronic components are considerably less than the volumes of glue needed to hold the prior art holding devices that have heretofore been used to fix their electronic components in place during their "hot, high pressure" injection processes. In any event, applicant has found that droplets of glue having volumes of about 0.007 cc will produce mounds of glue having heights or thicknesses that are especially well suited to holding the electronic components in place during applicant's partial curing and ensuing cold, low pressure injection steps. Taking into consideration the height of the void space between the top and bottom layers (i.e., the thickness of the core layer), applicant has found that mounds of glue whose height, upon partially curing, (e.g., the vertical radius of a hemispherical-like glue body) that is between about 0.20 mm and about 0.01 mm will give particularly good results. Glue body heights or thicknesses between about 0.075 mm to about 0.13 mm are even more preferred.

It also should be noted here that, in general, an electronic component that is placed upon such a body of freshly dispensed glue will to some degree "sink" into that body of glue. Indeed, in some instances, the electronic component may even be purposely mechanically forced into that body of glue before it "partially cures". In any event, applicant prefers that the electronic components of his smart cards do not come into abutting contact with the layer of sheet material upon which the glue is placed. Hence the glue should partially cure to an extent that the electronic component does not "sink" into direct contact with the bottom layer. This preference follows from the fact that applicant has found that such electronic components are better protected against torsional forces and/or shocks if they are virtually completely immersed in the thermoset material that forms the core layer of applicant's cards. In other words, applicant prefers to set his electronic component(s) on a glue "pedestal" arrangement so that the thermoset can invade the space between the bottom of the electronic component and the top of the layer material upon which the glue is placed. By way of example only, using applicant's gluing methods, a section of an antenna may be though of as "bridging" or spanning the distance between two mounds of glue so that the incoming thermoset can easily invade the space under the antenna as well as the space above and around the antenna. Taking into consideration the fact that applicant's electronic components will to some degree "sink" into a freshly laid mound of glue under the influence of gravity, applicant prefers that his electronic components generally end up being positioned in the "partially cured" glue (as the term "partially cured" is used in this patent disclosure) at a distance of from about 0.01 mm to about 20 mm away from (e.g., "above") the inside surface of the sheet of layer material to which the glue adheres. Again, in some even more preferred embodiments of this invention, such electrical components will be finally positioned at heights above the glue-contacting layer of the smart card at distances ranging from about 0.075 to about 0.13 mm in order to locate the electronic component near the center region of the void space and, hence, near the center region of the core of cured thermoset material that lies between the top and bottom layers of applicant's finished smart cards.

Regardless of the physical position of applicant's glues, their exact volumes, their percent shrinkage, or the identity of the electrical component(s) with which they make physical contact, applicant's low shrinkage glues also should be further characterized by their ability to be "at least partially cured"—but preferably not totally cured—in about 0.1 to about 40 seconds (and even more preferably in about 0.1 to about 5 seconds). Better yet, they should at least partially cure in less than 3 seconds. Again, for the purposes of this patent disclosure the expression "at least partially cure" can be taken to mean that the glue is cured to an extent that it is able to hold the electronic component in place while that electronic component is being immersed in the polymeric thermosetting material under the injection pressures being employed (e.g., under injection pressures of 80 to 120 psi)—and thereafter be "totally" cured while it is immersed in the thermoset polymer. The use of higher thermoset injection pressures will generally imply more extensive partial curing. Again, complete curing before the glue is immersed in the thermoset is not preferred because such complete curing (even by low shrinkage glues) may cause damage to the sheet or layer material (e.g., PVC) upon which the glue is placed.

Applicant's mounds of partially cured glue (be the glue a CA type glue, or a UV curable glue, or some other type of glue) are thereafter "completely" cured by being immersed in the thermoset material and/or by residing in that thermoset material for relatively long periods of time, e.g., for time periods that are much longer than the preferred 5 seconds or less in which the glue is "partially cured" to an extent that it can hold an electronic component in place during the injection step of applicant's overall process. Indeed, the complete curing of many "partially cured" glues in such a thermoset material may take hours, even days. When so immersed in a polymeric thermoset material, the "final curing" (e.g., as much as the last 90% of the total curing that the glue undergoes) of such a partially cured glue will do little damage to the sheet of polymeric material to which the glue has been applied in comparison to the damage that may be done to the sheet material if the glue is allowed to completely dry before it is immersed in the thermoset polymer. For the purposes of this patent disclosure, applicant's "partially cured" glues may experience between about 10 percent to about 90 percent of their total curing after the glue is immersed in the thermoset material that is injected into the void space between the card's top and bottom layers. Stated from another perspective, the glue can be from about 10 to about 90 percent partially cured before it is immersed in the thermoset material.

It might also be noted here that the curing of applicant's glues is believed to generally take place according to a logarithmic function having a general form $C=1-e^{tK}$ where C is the percentage of the total curing the glue undergoes, t is time in seconds, K is a proportionality constant and e=2.7183. In effect applicant seeks to partially cure his glues such that the percentage of curing that takes place before the glue is immersed in the thermoset lies between those points where the percentage of total curing is between 10 percent and 90 percent. It might also be noted at this point that many thermoset polymers may take up to about 24 hours to cure after they are injected into the void space between applicant's top and bottom layers. Hence, the thermoset material may (or may not) totally cure before the glue does.

Preferably, these low shrinkage glues also will be further characterized by the fact that they do not cause any so-called "artifacts" in the center or core layer of applicant's cards by chemically reacting with the injected thermoset material that ultimately becomes the card's center layer. That is to say that such glues preferably will not form chemical reaction products with a thermoset polymeric material that (1) have a color that is appreciably different from the color of the cured thermoset polymer or (2) that blisters the thermoplastic bottom/top layers.

Applicant's methods for making the smart cards of this patent disclosure also may, as an optional feature, involve the use of at least one gas venting procedure and/or at least one excess polymeric material receiving receptacle. More preferably, there will be at least one such receptacle per card-forming cavity. The presence of such gas venting and/or excess material receiving receptacles will allow gases (e.g., air, and the gaseous reaction products associated with those usually exothermic chemical reactions of the polymeric material forming ingredients) and/or relatively small amounts of the incoming thermoset polymeric material itself to escape from each void space during applicant's cold, low pressure forming operations and be received in such receptacles and/or be totally flushed out of the mold system. These gas venting procedures and excess material receptacles generally serve to prevent imperfections that may otherwise be created by entrapping gases in the void space during the injection of the polymeric material.

Thus, this aspect of applicant's invention involves injecting a flowable liquid or semi-liquid moldable polymeric material into a void space between the top and bottom layers of applicant's smart card in a process wherein; the top and bottom molds are respectively abutted against the top and bottom layers of the smart card at a mold parting line perimeter or lip region at pressures that are sufficient to (a) completely fill the void space with a liquid or semi-liquid thermosetting polymeric material under the cold forming conditions used in the hereindescribed processes, (b) drive minor amounts of the polymeric material out of the card forming cavities and into the excess material receptacle and/or (c) drive the gases in the void space to the excess material receptacle and/or drive such gases completely out of the mold system (e.g., drive such gases out of the mold at the parting line regions where the top and bottom mold shells come together). Thus, the mold lip pressures used in applicant's procedures should be sufficient to hold the pressures at which the thermoplastic material is injected in order to completely fill the void space between the top and bottom (e.g., between about ambient pressure and 200 psi) but still permit small amounts of the thermoset material and any gases to be flushed or squirted out of the mold system at its parting line. In other words, in these preferred embodiments, applicant's "excess" material receptacles need not, and preferably will not, receive all of the excess material injected into the void space. Excess thermoset material and/or gases also may be—and preferably are—expunged from the entire mold system at the parting line where the top mold lip and the bottom mold lip abut against each other as shown by parting line 7 in FIG. 3(A) (1) or abut against the top layer 24 and the bottom layer 26 as shown in FIG. 3(A). In effect, the incoming liquid or semi-liquid thermoset polymeric material completely fills the void space, immerses the electronic components and forces any air present in the void space between the top and bottom layers (as well as any gases created by the chemical reaction of the starting ingredients of the polymeric material) out of the void space and in some preferred cases completely out of the mold system. All such actions serve to eliminate any surface imperfections such as surface "pock marks" and/or encapsulated bubbles that might otherwise form if such gases were entrapped in the thermoset polymeric material when it solidifies to form the core region of applicant's cards.

Finally it also should be noted that the top and/or bottom layers used in applicant's processes may be at least partially molded into cavity-containing forms before they are placed in the mold system used to make the smart cards of this patent disclosure. Hence, the "cold, low pressure" molding operations called for in this patent disclosure may be only a part of the total molding to which these layer or sheet materials are subjected. Thus, for example the cold, low pressure molding procedures of this patent disclosure may provide only a partial amount of the total molding experienced by a molded top layer of applicant's smart card. In the more preferred embodiments of this invention, however, the top layer will experience a major portion, e.g., at least 50 percent, and more preferably all of the total molding it experiences (as defined by the change in the volume of the cavity created by the molding operation) by the cold, low pressure molding operations of this patent disclosure.

Expressed in patent claim language, a preferred embodiment of applicant's process for making a smart card having a top layer, a core layer in which an electronic component is embedded and a bottom layer, will comprise (1) using at least one mound of a low shrinkage glue to connect an electronic component to an inside surface of the bottom layer of the smart card to form a bottom layer/low shrinkage glue/electronic component assembly; (2) partially curing the low shrinkage glue to produce a bottom layer/partially cured glue/electronic component assembly; (3) positioning the bottom layer/partially cured glue/electronic component assembly in a bottom mold; (4) positioning a top layer in a top mold; (5) closing the top mold to the bottom mold in a manner that creates a void space between the top layer and bottom layer; (6) injecting a thermosetting polymeric material into the void space at a temperature and pressure which are such that: (a) the electronic component is held in place by the partially cured glue, (b) at least one layer of the smart card is at least partially cold, low pressure molded into a cavity in the mold device, (c) gases and excess polymeric material are driven out of the void space, (d) the electronic component is encapsulated in the thermosetting polymeric material before the partially cured glue is completely cured and (e) the thermosetting polymeric material bonds with both the top layer and the bottom layer to produce a unified precursor smart card body; (7) removing the unified precursor smart card body from the mold device; and (8) trimming the precursor smart card to a desired dimension to produce a smart card. Other optional procedures described in this patent disclosure may be used to further augment and enhance this preferred process in order to produce smart cards having still better surface quality characteristics.

BRIEF DESCRIPTION OF THE DRAWINGS

FIG. 1 is a cut-away side view of a layer or sheet of a plastic material (e.g., PVC) that can be used to make applicant's smart cards. This view is shown before (FIG. 1(A)) and after (FIG. 1(B)) a drop of a prior art, "high shrinkage" glue is allowed to cure on that layer of plastic material.

FIG. 2 is a cut-away side view of a smart card made according to the teachings of this patent disclosure.

FIGS. 3(A) and 3(B) are cut-away side views of a mold tool set up for making a first preferred embodiment of a smart card of this patent disclosure wherein certain smart card components are shown before a liquid polymeric material is injected between the card's top and bottom layers (see FIG. 3(A)) and after (see FIG. 3(B)) the polymeric material is injected into a void space between the top and bottom layers and thereby filing said void space with a polymeric material and cold forming the top layer of the smart card to the contour of the top mold's card-forming cavity.

FIG. 3(A)(1) depicts another preferred embodiment of this invention wherein the mold tool shown in FIG. 3(A) is further provided with an excess polymeric material and/or gas receiving receptacle. FIG. 3(B) (1) depicts the result of injecting the mold system depicted in FIG. 3(A)(1) with a thermosetting polymeric material under the cold forming, low pressure conditions of this process.

FIG. 3(A)(2) illustrates another preferred embodiment of this invention wherein the sheet or layer components of applicant's cards terminate at the front edge of a excess material receiving receptacle. FIG. 3(B)(2) shows the system shown in FIG. 3(A)(2) after the void space (and the excess material receptacle) are filled by injection of a thermosetting polymeric material.

FIG. 6 depicts cut-away plan and cross section views of various comparative gates for injection of applicant's thermoset materials.

FIG. 7 depicts a mold tool system capable of making multiple (i.e., four) smart cards simultaneously.

DETAILED DESCRIPTION OF THE INVENTION

Figure 4:
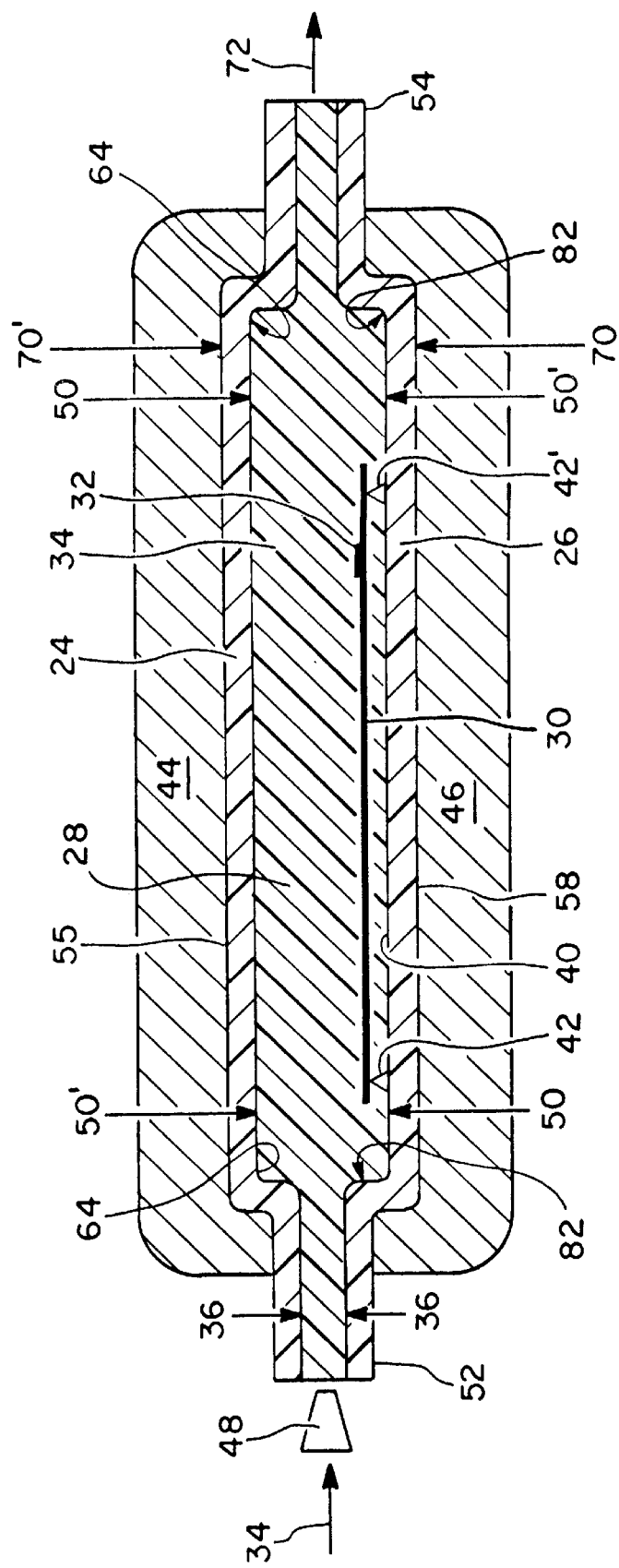
FIG. 4 is a cut-away side view of a mold tool making a second embodiment according to this patent disclosure wherein both the top layer and bottom layer are each cold formed in their respective mold cavities.

FIG. 1(A) is contrasted with FIG. 1(B). In effect, FIG. 1(B) illustrates the problem that is solved by the smart card making processes of this patent disclosure. To this end, FIG. 1(A) depicts, in cut-away cross section, a sheet or layer of a plastic material 10 (e.g., a sheet or layer of polyvinyl chloride, polyurethane, etc.) having a top surface 12 and a bottom surface 14. Such sheets will generally have a thickness 13 ranging from about 0.075 mm to about 0.25 mm. A mound, drop, or dollop of a liquid or semi-liquid, high shrinkage, glue 16 is depicted as being recently dispensed on the top surface 12 of the plastic sheet 10 shown in FIG. 1(A). The mound of recently dispensed glue 16 depicted in FIG. 1(A) is shown having an initial width $W_1$. By way of contrast, FIG. 1(B) shows (in exaggerated form) the results of curing the mound of glue 16 shown in FIG. 1(A) to a smaller mound of cured glue 16'. The width $W_2$ of the mound of cured glue 16' depicted in FIG. 1(B) is considerably less than the width $W_1$ of the mound of the newly laid liquid or semi-liquid glue in FIG. 1(A). For the sake of simplicity, the decrease or shrinkage of the original width $W_1$ (i.e., $\Delta W_1$) of the mound of newly dispensed, high shrinkage glue is represented in FIG. 1(B) by the dimensions "½ $\Delta W$," on the left side of the mound of and a comparable "½ $\Delta W$" on the right side of said mound of cured glue 16'. Such curing is also depicted by a decrease in the volume of the original mound of glue 16. For example, this decrease in volume may be as much as 20 to 30 percent in many high shrinkage glues.

As previously noted the concept of a "high shrinkage" glue versus a "low shrinkage" glue also can be dealt with in terms of the increase in density of a cured glue relative to the density of that glue in its newly laid state. Again, for the purposes of this patent disclosure either of these changes (a decrease in volume or an increase in density) can be expressed as a percentage and either method of expressing percentage changes may be used for the purposes of this patent disclosure. In other words, for the sake of simplicity, a given percentage change in a volume decrease (or density increase) of a cured glue relative to its newly dispensed or uncured form, may be regarded as being substantially the same for the purposes of this patent disclosure. Thus, a glue that has undergone a 10 percent decrease in volume (i.e., a glue that has "shrunk" 10 percent) also may be regarded as a glue that has had a 10 percent increase in density—even though this percentage may not be precisely the same in any given case.

Descriptions of the extent of a glue's percentage shrinkage aside, the point to be made is that the curing process associated with high shrinkage glues causes the mound of glue 16 depicted in FIG. 1(A) to shrink from an initial size which can be thought of as having an initial width $W_1$ (wherein the mound of glue is in a semi-liquid or tacky state) to a final width $W_2$ (wherein the cured glue 16' is in a substantially solid state) and that this high degree of shrinkage (e.g., greater than about 15 percent—and often as much as 20–30 percent) causes the top surface 12 of the layer or sheet of plastic material to "wrinkle up" or otherwise deform, e.g., form wrinkles such as those indicated by item 18 in FIG. 1(B). Such deforming actions create forces in the relatively thin layer (e.g., 0.075 to 0.25 mm thick) of plastic material 10. These forces are transmitted to the bottom surface 14 of that layer of plastic material 10. These transmitted forces, in turn, cause deformations 20, (curves, bends, waves, wrinkles, etc.), in the bottom surface 14 of the plastic layer 10. Again, any such deviations from a flat, smooth surface 14 are regarded as undesired deformities by the smart card industry and, hence, are to be minimized to the fullest extent possible. Consequently, achievement of smart card surfaces having no such waves, bends, wrinkles, etc. is one of the primary objects of the processes of this patent disclosure.

FIG. 2 depicts a cut-away side view of a smart card 22 made according to the teachings of this patent disclosure. In its finished form, such a smart card will be comprised of a top layer 24, a bottom layer 26, and a center or core layer 28 in which the smart card's electronic components (e.g., an antenna 30, computer chip 32, etc.) are embedded in a thermosetting polymeric material 34 (e.g., an initially liquid or semi-liquid thermosetting resin) that, upon curing, constitutes the center or core layer 28 of a finished smart card. The thermosetting material 34 that eventually becomes the center layer 28 of the smart card is injected into the void space 36 between the top layer 24 and bottom layer 26. This injected polymeric material 34 should be capable of being injected under the relatively cold, low pressure forming conditions employed in applicant's process.

In any case, such thermosetting polymeric materials will be injected into, and fill, the void space 36 defined between the inside surface 38 of the top layer 24 and the inside surface 40 of the bottom layer 26. Upon curing, the polymeric material 34 of the center layer 28 should bond or otherwise adhere to both the inside surface 38 of the top layer 24 and the inside surface 40 of the bottom layer 26 to produce a unified card body. Such adherence can be aided by treating the inside surfaces 38 and 40 of the top and bottom layers in any one of several ways. For example, bonding agents known to this art may be employed to enhance bonding between the core layer-forming thermoset material and the material(s) from which the top and bottom layers are made (e.g., PVC). By way of example only, Minnesota Mining and Manufacturing's base primer product 4475® can be used for this bond enhancing purpose, especially when the top or bottom layer material is PVC. Other treatments that can be applied to the inside surfaces of the top and/or bottom layers could include plasma corona treatments and acid etching.

The smart card's thickness 39 is defined by placement of the mold faces (not shown in FIG. 2) as the thermoset material is injected into the void space 36 as part of the cold, low pressure forming process of this patent disclosure. In effect, the injection of the thermoset material into the void space 36 between the top and bottom layers fills any portion of that void space 36 that is not otherwise occupied by the electronic components or by the mound(s) of low shrinkage glue upon which the electronic components are placed.

FIG. 2 also illustrates how the inside surface of the top and/or bottom layers 24 and/or 26 also may be provided with strips of film bearing alphanumeric and/or graphic information and designs. Thus, if the top layer were made of a translucent polymeric material such as PVC, the alphanumeric/graphic information would be visible to the card user. For example, in FIG. 2 such a alphanumeric/graphic information-containing film strip 41 is shown positioned on the inside surface 38 of the top layer 24. The inside surfaces of these layers also may be provided with layers of materials such as film layers or coatings whose function is to increase (or reduce) the opacity of the card body so that its electronic components are not visible through the card body.

Next, it should be noted that the smart card's electronic components (e.g., antenna 30, chip 32, etc.) are preferably positioned above the inside surface 40 of the bottom layer 26 through use of one or more drops or dollops of applicant's low shrinkage glue 42. The electronic components are most preferably placed on top of two or more mound(s) of glue 42, 42', etc. in the manner generally suggested in FIG. 2 so that the incoming liquid or semi-liquid polymeric material will flow under such electronic components as well as immerse these components from above and from their sides. In other words, in the more preferred embodiments of this invention the mound(s) of glue will serve as one or more "pedestal(s)" upon which the electronic components are placed so that the underside of the electronic components do not come into direct contact with the top surface 40 of the bottom layer 26, but rather are immersed in the incoming thermoplastic material 34. This circumstance enables these electronic components to better resist any flexure and/or torsion forces the smart card may encounter upon either or both of its major outside surfaces or on any of its four outside edge surfaces. In some of the more preferred embodiments of this invention these electronic components (e.g., antenna 32) will be positioned by the glue at a distance 43 of from about 0.075 mm to about 0.13 mm above the inside surface 40 of the bottom layer 26.

FIGS. 3(A) and 3(B) are contrasted to illustrate a first preferred embodiment of applicant's methods for making smart cards. That is to say that FIG. 3(A) depicts a particularly preferred embodiment of this invention wherein a flat, top layer or sheet of plastic material 24 such as PVC is shown before it is cold, low pressure formed according to the teachings of this patent disclosure. In other words, FIG. 3(A) depicts the mold tool set-up just prior to the injection of the polymeric material and wherein a flat, top layer 24 (e.g., a flat sheet of PVC) is shown as it is initially placed under a card-forming cavity of the top mold 44 and a bottom layer 26 (e.g., another flat sheet of PVC) is shown as it is placed over a bottom mold 46. Again, however, in some less preferred, but still viable, embodiments of applicant's processes the top layer 24 may be pre-molded or at least partially pre-molded, preferably, to the general contour of the card-forming cavity in the top mold. By way of comparison, the bottom mold 46 has no cavity comparable to the cavity in the top mold 44. FIG. 3(B) depicts the effects of injecting the thermoset polymeric material into the void space 36 between the top and bottom layers 24 and 26. Thus, FIG. 3(B) shows the top layer 24 after it has been molded into a card-forming cavity 64 in the top mold 44. A nozzle 48 for injecting a liquid or semi-liquid, thermoplastic or thermosetting polymeric material 34 is shown being inserted into an orifice 49 that leads to the void space 36 that is defined between the inside surface 38 of the top layer 24 and the inside surface 40 of the bottom layer 26. The distance between the top surface of the top layer and the bottom surface of the bottom card is depicted by distance 50. The void space 36 is shown extending from the left end 52 to the right end 54 of the juxtaposed top layer 24 and bottom layer 26. In other words, in FIG. 3(A) the outside surface 55 of the top layer 24 is not yet in contact with the inside surface 56 of the card-forming cavity 64 of the top mold 44. By way of contrast, the outside surface 58 of the bottom layer 26 is shown in substantially flat, abutting contact with the inside surface 60 of the bottom mold 46.

In both FIGS. 3 (A) and 3 (B) the electrical components of the smart card (e.g., its antenna 30, chip 32, etc.) are shown positioned above the inside surface 40 of the bottom layer 26. By way of example only, such electrical components are shown pedestaled on two dabs or dollops 62 and 62' of applicant's low shrinkage glue. These glue pedestals hold the electronic components far enough above the inside surface 40 of the bottom layer (e.g., from about 0.075 mm to about 0.13 mm) that the incoming thermoset polymeric material 34 can invade the region 63 under the electrical components as well as the regions above these electronic components. Again, such glue pedestal arrangements are preferred because the presence of the thermoset polymeric material under the electronic components tends to augment the protection of such electronic components against any forces or shocks that may be received by the outside surfaces (i.e., the outside of the bottom layer and/or the outside of the top surface) of the card.

In FIG. 3(A) the top mold 44 is shown having a cavity 64 which defines the surface contour of the top of the smart card to be formed during the injection process. To this end, the injection of the liquid or semi-liquid thermoset polymeric material 34 should be under pressure and temperature conditions such that the top layer 24 is cold, low pressure, formed into the cavity 64 of the top mold 44. FIG. 3(B) shows how the cold, low pressure forming process of this patent disclosure has in fact conformed the top surface 55 of the top layer 24 to the configuration of the card-forming cavity 64 in the top mold 44. Again, the bottom surface 58 of the bottom layer 26 is shown in FIG. 3(B) molded against a substantially flat inside surface 60 of the bottom mold 46. This is a particularly preferred arrangement for making the smart cards of this patent disclosure.

In FIGS. 3(A) and 3(B) a front lip region 66 of the top mold 44 and a front lip region 68 of the bottom mold 46 are shown spaced apart from each other by a distance 70 that (taking into consideration the thickness of the top and bottom layers 24 and 26), in effect, defines the distance 36 (i.e., the width of the void space) between the top layer 24 and the bottom layer 26 at these lip regions of the two molds 44 and 46. This distance 70 should be such that the thermoset polymeric material 34 can be injected into the void space 36 over the entire length of the card (e.g., from its left side 52 to its right side 54). The counterpart distance 70' of the mold device setting on the right side of the system shown in FIG. 3(A) may differ from that of its counterpart distance 70 on the left side. In any case the distance 70' should be such that the distance 36' defined between the inside surface 38 of the top layer 24 that passes through the rear lip 66' of the top mold 44 and the inside surface 40 of the bottom layer 26 that passes through the rear lip 68' of the bottom mold 46 is very small—but still finite. That is to say that this very small distance 36' should be large enough to allow gases 72 (e.g., air, polymeric ingredient reaction product gases, etc.) in the void space 36 that originally existed between the top and bottom layers 24 and 26 (see again, FIG. 3(A)) and excess polymeric material to be exhausted from said void space 36, but still be small enough to hold the injection pressures used to inject the thermoset polymeric material. Indeed, the distance 36' is preferably sized large enough to allow even thin layers of the liquid polymeric material 34 itself to be "squirted" or "flashed" out of the void space 36—and thus allowing all gases residing in, or created in, the void space 36 to be expunged out of said void space and, indeed, out of the mold system itself. Thus, all such gases 72 are completely replaced by the incoming liquid thermoset material 34. This gas exhaust technique serves to prevent gas bubbles from forming in the body of the thermoset material 34 that eventually (i.e., upon curing of the thermoset material) comprises the center layer 28.

FIGS. 3(A)(1) and 3(B)(1) depict an even more preferred embodiment of the process that was generally illustrated in FIGS. 3(A) and 3(B). In FIGS. 3(A) and 3(B), the rear or right side 54 of the top layer 24 and bottom layer 26 are shown protruding out of their respective molds 44 and 46. consequently, the gases 72 (air and chemical reaction product gases) and "excess" polymeric material (i.e., polymeric material 34 in excess of that required to fill the void space 36) are expunged or exhausted out of the molds 44 and 46. This mold and exhaust arrangement may work better with some thermoset injection materials (and some top and bottom layer materials) than it does with others. Applicant has, however, also found that in some cases, the overall mold system depicted in FIGS. 3(A) and 3(B) is sometimes left with residual bodies of solidified excess polymeric material that, in one way or another, interfere with the manufacture of succeeding smart card(s). In effect this arrangement sometimes leaves the overall mold device in a "dirty" condition that is not conducive to making high quality smart cards in succeeding cycles of the high speed molding operations employed to make them.

The embodiment shown in FIGS. 3(A)(1) and 3(B)(1) can be used to correct this problem. It does this through the use of a top mold 44 that also has an excess material receptacle cavity 74. The function of this excess material receptacle cavity 74 is to (1) receive and hold any excess thermoset material and any gases 76 (air, chemical reaction product gases) purged from the void space 36 by the injection of the polymeric material 34 in said void space. Indeed, in some of the more preferred embodiments of this invention, excess polymeric material 34' will be purposely injected into the void space 36 in order to drive out any gases that would otherwise be entrapped or entrained in the center layer 28 of the card. Applicant's excess material injection procedure may entrap some of these gases in the excess polymeric material 34' in the manner generally indicated in FIGS.

3(B)(1) or some or all of these gases may be exhausted from the mold system at its parting line 77 as suggested by the direction of arrow 72. Again the "excess" thermoset material 34' is eventually trimmed from such "precursor" cards in order to create a "finished" card. It also should be noted that in this preferred embodiment of applicant's process, the top layer 24 is molded into the top regions 78 of the excess material receptacle 74 in the same general way that the top layer 24 is molded into the card forming cavity 64.

FIGS. 3(A)(2) and 3(B)(2), also by way of contrast, depict another preferred embodiment of this invention wherein the top layer 24 and the bottom layer 26 only extend to the front edge 80 of the excess material receptacle 74. Thus the top layer 24 is not molded into the excess material receptacle 74 as it was in the case shown in FIG. 3(B)(1). In this embodiment, entrapped gases 76 and excess polymeric material 34' are not entirely ejected from the mold cavity system, as they were in the process shown in FIG. 3(B), but rather are "captured" in a receptacle 74 that itself also resides in the overall mold cavity system. It also should be noted that, in FIG. 3(B)(2) the top 55 of the top layer 24 does not extend into a side surface 80' of the receptacle 74 as it did in the system depicted in FIG. 3(B)(1). Those gases 72 that are not entrapped in the excess polymeric material 34' may be, and preferably are, exhausted from the mold system at its parting line 77.

FIG. 4 illustrates a somewhat less preferred, but still viable, embodiment of this invention wherein the bottom mold 46 is provided with a cavity 82 much in the way that the top mold 44 has such a cavity 64.

Figure 5:
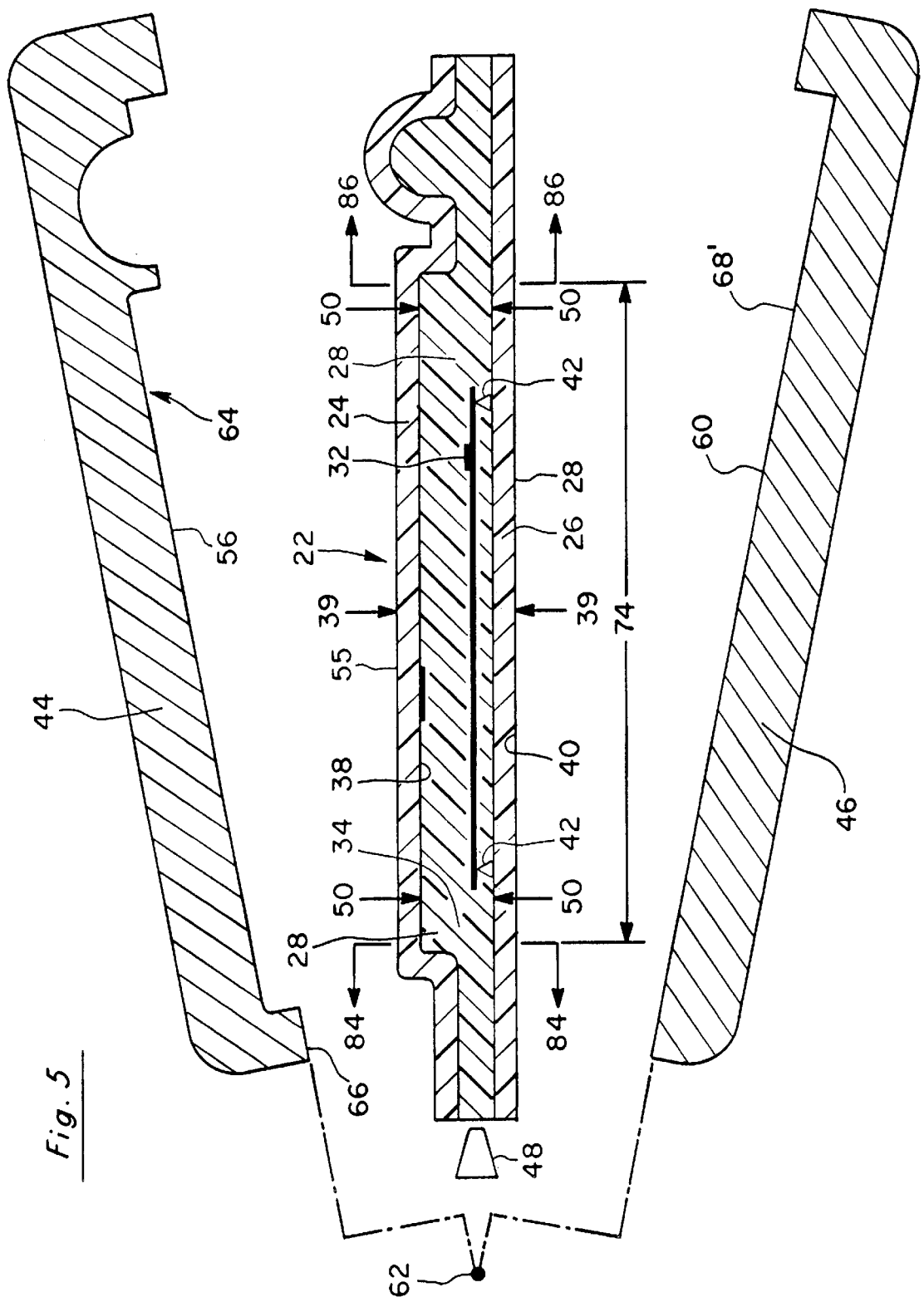
FIG. 5 is a cut-away view showing a mold tool being removed from a precursor smart card body formed by the system generally depicted in FIG. 3(B)(1).

FIG. 5 shows a semi-finished or precursor smart card of the type shown in FIG. 3(B)(1) being removed from a mold system. Section lines 84—84 and 86—86 respectively show how the left end and right end of the precursor smart card can be cut or trimmed away to create the sharp edges and precise dimensions of a finished smart card. For example, ISO Standard 7810 requires that such cards have a length 74 of 85 mm.

FIGS. 6(A) through 6(E) contrast various gates into which a thermoset polymeric material could be injected in order to form a given smart card. For example, FIG. 6(A) depicts a prior art gate configuration Q, R, S, T commonly referred to as a fan type gate. The term "fan" refers to the fan-like, general configuration of the gate into which a thermoset polymeric material 34 is injected from a runner 94 that feeds the various gates in a manifold fashion. These fan-like gate configurations are often employed with prior art, hot, high pressure molding procedures. The narrowest part of the fan Q, R, S, T is shown provided with an injection port 88 for receiving the incoming thermoset polymeric material 34. As seen in FIGS. 6(A) and 6AA, the injection port 88 has a relatively small diameter 90, relative to the width 92 of the fan (i.e., the distance from points S to point T) in the region where the gate feeds into the cavity that forms the general outline S, T, U, V of the smart card to be formed.

FIGS. 6(D) to 6(E) by way of contrast, depict applicant's gate configurations. It might also be noted here that applicant prefers to taper these gates in the manner previously described but which is not shown in FIGS. 6(B) to 6(E). In any event, the diameters of applicant's gates are significantly larger than the gates used in prior art smart card molding processes. For example the diameter 90 of the injection port 88 of such prior art systems may be something on the order of 7.0 mm while the width of the fan along the line extending from point S to point T (which is also the nominal width of the credit card to be formed) is about 54 mm (as per the requirements of ISO Standard 7810). Hence, as seen in the cross sectional view depicted in FIG. 6AA, the diameter of the prior art injection port 88 of FIG. 6(A) that leads from the main polymeric material supply runner 94 to the gate 96 is about ⅒ of the width 92 of the edge of the card to be formed. Such relative dimensions (a gate that is ⅒ as wide as the edge of the card being serviced by that gate) suffice in most prior art manufacturing methods wherein hot, high pressure forming conditions are being applied to a thermoplastic material. For example, some prior art processes inject their polymeric materials at temperatures ranging from in excess of 200° F. to 1000° F. at pressures ranging from 500 to 20,000 psi. Again such high temperature and high pressure conditions differ considerably from those low temperature and pressure conditions employed in applicant's processes.

By way of contrast with such prior art runner gate systems, such as the one depicted in FIG. 6(A), applicant's gate systems, as depicted in FIGS. 6(B) to 6(E), for making smart cards that are made through use of relatively cold, low pressure conditions are characterized by their relatively wide gates. Applicant has found that under the cold, low pressure conditions (e.g., 56° F. to 100° F. and atmospheric pressure to 200 psi) employed in the hereindescribed processes, higher quality precursor cards (and hence finished cards) are produced when the width or diameter 90' of an injection port 88' for a gate 96' is considerably wider than those employed in prior art manufacturing methods. To this end, FIGS. 6(B) through 6(E) illustrate four variations of applicant's "wide gate" concept. In FIG. 6(B), for example, the diameter 90' of injection port or gate 88' is about 50 percent of the width 92' the precursor card to be formed. In FIG. 6(C) the width 90' of the injection port or gate 88' is about 80 percent of the width (the distance from point S' to point T') of the precursor card. In FIG. 6(D) the width 90' of the injection port or gate 88' and the width 92' (the distance from point S' to point T') of the precursor credit card (S', T', U', V') are substantially the same. FIG. 6(E) depicts a card molding system wherein the width 80' of the gate is greater (e.g., about 25% greater) than the width 92' of the edge of (depicted by the distance from point S' to point T') of the precursor smart card S', T', U', V'. In general, applicant has found that the best results are obtained when the width 90' of his gates are from about 25% to about 200% of the width (the distance from point S' to point T') of the edge of the precursor card serviced by the gate. This contrasts sharply with most prior art (high temperature/high pressure) systems where the width of the injection port (again note the distance from point Q to point R in FIG. 6(A)) is usually less than about 10 percent of the width (the distance from point S to point T) of the edge of the card being serviced by that gate.

FIG. 7 illustrates a molding procedure being carried out according to some of the preferred embodiments of this patent disclosure wherein four credit cards are being molded simultaneously in a system wherein, by way of example only, the closest two cavities (closest to the injection nozzle 48) are being fed with an incoming thermoset polymeric material 34 via respective gates 96' having a width (e.g., the distance from point 98 to point 100) that is about one half of the width of the precursor card (the distance from point 102 to point 104) while the two more remote (i.e., more remote from the injection nozzle 48) card-forming cavities have injection ports and gates that are substantially as wide as the width (102 to 104) of the precursor card itself. The dotted line 106 shown in FIG. 7 depicts the outline of a finished smart card after the edges have been trimmed to (a given size and to eliminate the excess thermoset material in the excess material receptacles 74) to produce a finished smart card (e.g., one having a length of 85 mm and a width of 54 mm as per ISO Standard 7810). Again, these cards may be further "finished" by application of alphanumeric/graphic information on their major exterior surfaces, e.g., by various printing and/or film application procedures known to those skilled in this art.

While this invention has been described with respect to various specific examples and a spirit which is committed to the concept of the use of special glues and gluing procedures, it is to be understood that the hereindescribed invention should be limited in scope only by the following claims.

Thus, what is claimed is:

1. A smart card comprising a top layer, a core layer in which an electronic component is embedded and a bottom layer, and wherein said smart card further comprises at least two mounds of low shrinkage glue that serve to hold the electronic component in a given position in the core layer such that the electronic component is not in contact with the top layer or the bottom layer and such that a portion of a material that constitutes the core layer is under the electronic component and between the mounds of low shrinkage glue.

2. The smart card of claim 1 wherein the mound of low shrinkage glue positions the electronic component at least about 0.01 mm above the bottom layer.

3. The smart card of claim 1 that further comprises a bonding agent located between the top layer and the core layer and a bonding agent located between the bottom layer and the core layer.

4. The smart card of claim 1 that further comprises an alphanumeric/graphic information-containing film that is positioned between the top layer and the core layer.

5. The smart card of claim 1 that further comprises an opacity incr easing layer of material that is positioned between the top layer and the core layer and a thermosetting material that is provided with an opacity increasing pigment.

6. The smart card of claim 1 that further comprises alphanumerical/graphic information that is placed on a major outside surface of the smart card.

7. A smart card comprising a top layer, a core layer in which an electronic component is embedded and a bottom layer, and wherein said smart card further comprises at least two mounds of low shrinkage glue each having a volume of less than about 0.1 cc that serve to hold the electronic component in a position that is between about 0.075 and about 0.13 mm above an inside surface of the bottom layer such that a portion of a material that constitutes the core layer is under the electronic component and between the mounds of low shrinkage glue.

* * * * *